United States Patent
Zheng et al.

(10) Patent No.: US 7,999,338 B2
(45) Date of Patent: Aug. 16, 2011

(54) MAGNETIC STACK HAVING REFERENCE LAYERS WITH ORTHOGONAL MAGNETIZATION ORIENTATION DIRECTIONS

(75) Inventors: Yuankai Zheng, Bloomington, MN (US); Zheng Gao, San Jose, CA (US); Wenzhong Zhu, Apple Valley, MN (US); Wonjoon Jung, Bloomington, MN (US); Haiwen Xi, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 115 days.

(21) Appl. No.: 12/502,209

(22) Filed: Jul. 13, 2009

(65) Prior Publication Data

US 2011/0006385 A1 Jan. 13, 2011

(51) Int. Cl.
*H01L 29/82* (2006.01)
*G11C 11/02* (2006.01)

(52) U.S. Cl. ............ 257/421; 257/414; 257/E29.323; 438/3; 360/324.2; 365/157; 365/171

(58) Field of Classification Search .......... 257/20, 257/414, 421–427, E29.323; 438/3; 360/324–326, 360/313; 365/157–158, 171–173
See application file for complete search history.

(56) References Cited

U.S. PATENT DOCUMENTS

| | | | |
|---|---|---|---|
| 4,733,371 A | 3/1988 | Terada | |
| 5,191,223 A | 3/1993 | Munekata | |
| 5,646,419 A | 7/1997 | McCaldin | |
| 5,673,225 A | 9/1997 | Jeong | |
| 5,761,115 A | 6/1998 | Kozocki | |
| 5,920,446 A | 7/1999 | Gill | |
| 5,982,670 A | 11/1999 | Yamashita | |
| 6,072,718 A | 6/2000 | Abraham | |
| 6,178,136 B1 | 1/2001 | Lin | |
| 6,226,197 B1 | 5/2001 | Nishimura | |
| 6,252,796 B1 | 6/2001 | Lenssen | |
| 6,381,106 B1 | 4/2002 | Pinarbasi | |
| 6,469,926 B1 | 10/2002 | Chen | |
| 6,532,164 B2 | 3/2003 | Redon | |
| 6,542,000 B1 | 4/2003 | Black | |
| 6,569,745 B2 | 5/2003 | Hsu | |

(Continued)

FOREIGN PATENT DOCUMENTS

GB 2 422 735 8/2006

(Continued)

OTHER PUBLICATIONS

Sun, Spin-Current Interaction with a Monodomain Magnetic Body: A Model Study, Physical Review B, vol. 62, No. 1, Jul. 1, 2000.

(Continued)

*Primary Examiner* — Jami M Valentine
(74) *Attorney, Agent, or Firm* — Campbell Nelson Whipps LLC

(57) ABSTRACT

A magnetic cell includes a ferromagnetic free layer having a free magnetization orientation direction and a first ferromagnetic pinned reference layer having a first reference magnetization orientation direction that is parallel or anti-parallel to the free magnetization orientation direction. A first oxide barrier layer is between the ferromagnetic free layer and the first ferromagnetic pinned reference layer. The magnetic cell further includes a second ferromagnetic pinned reference layer having a second reference magnetization orientation direction that is orthogonal to the first reference magnetization orientation direction. The ferromagnetic free layer is between the first ferromagnetic pinned reference layer and the second ferromagnetic pinned reference layer.

11 Claims, 3 Drawing Sheets

U.S. PATENT DOCUMENTS

| | | |
|---|---|---|
| 6,584,016 B2 | 6/2003 | Park |
| 6,603,677 B2 | 8/2003 | Redon |
| 6,633,498 B1 | 10/2003 | Engel |
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhatacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,703 B2 | 5/2005 | Dieny |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissel |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Pancula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Vang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Hua |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apalkov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,728,622 B2 | 6/2010 | Chua-Eoan |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1* | 11/2005 | Valet .......................... 365/158 |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0233017 A1 | 10/2006 | Hosotami |
| 2006/0245117 A1 | 11/2006 | Nowak |
| 2007/0002504 A1 | 1/2007 | Huai |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1 | 5/2007 | Yoshikawa |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |
| 2007/0246787 A1 | 10/2007 | Wang |
| 2007/0297220 A1 | 12/2007 | Yoshikawa |

| | | |
|---|---|---|
| 2008/0026253 A1 | 1/2008 | Yuasa |
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagasi |
| 2010/0176471 A1 | 7/2010 | Zhu |

FOREIGN PATENT DOCUMENTS

| | | |
|---|---|---|
| WO | WO 2008/100868 | 8/2008 |

OTHER PUBLICATIONS

Slonczewski, Current-Driven Excitation of Magnetic Multilayers, Journal of Magnetism and Magnetic Materials 159 (1996) Ll-L7.
Berger, Emission of Spin Waves by a Magnetic Multilayer Traversed by a Current, Physical Review B, vol. 54, No. 13, Oct. 1, 1996-1.
PCT Search Report and Written Opinion dated Oct. 4, 2010.
Baek et al., Tech. Dig. IEDM (2004) 587.
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15, 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activiated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by a Two-Step Replication of Honeycomb Structures of Anodic Alumina, Science, OI. 268, Jun. 9, 1995.
Meng et al., A Spintronics Full Adder for Magnetic CPU, IEEE Elec. Dev. Lett. 26, 360 (2005).
Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Mar. 10, 2010.
PCT Search Report and Written Opinion dated Mar. 22, 2010.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1o-FePt Layers, Applied Physics Letters 88, 172504 (2006).
Sharrock, Time Dependence of Switching Fields in Magnetic Recording Media (Invited), J. Appl. Phys. 76 (10), Nov. 15, 1994.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng.
U.S. Appl. No. 12/106,382, filed Apr. 21, 2008, Inventors: Xi et al.
U.S. Appl. No. 12/125,975, filed May 23, 2008, Inventor: Xi.
U.S. Appl. No. 12/126,014, filed May 23, 2008, Inventor: Xiaohua Lou.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008, Inventor: Zheng.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/396,905, filed Mar. 3, 2009, Inventor: Gao.
U.S. Appl. No. 12/398,214, filed Mar. 5, 2009, Inventor: Wang et al.
U.S. Appl. No. 12/425,457, filed Apr. 17, 2009, Inventor: Gao (14787).
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielelectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.
Sun, J.Z., Spin Angular Momentum Transfer in Current-Perpendicular Nanomagnetic Junctions, IBM J. Res & Dev., vol. 50, No. 1, Jan. 2006, pp. 81-100.

* cited by examiner

MAGNETIC STACK HAVING REFERENCE LAYERS WITH ORTHOGONAL MAGNETIZATION ORIENTATION DIRECTIONS

BACKGROUND

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation that defines the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

Application of spin torque transfer memory has a switching current density requirement generally at $10^6$ to $10^7$ A/cm$^2$, which leads to difficulty in integrating with a regular CMOS process. It is desirable to reduce the switching current density significantly in order to make a feasible product. Various attempts have been made.

However, there is a dilemma between switching current and data stability in spin torque transfer cells. A low switching current can reduce data retention due to thermal instability of the spin torque transfer cells. Spin torque transfer cell design that can achieve both low switching current with sufficient data retention is desired.

BRIEF SUMMARY

The present disclosure relates to magnetic cells, such as a spin torque memory cell, that have magnetic two reference layers or elements that have orthogonal magnetization orientation directions. These spin torque memory cells quickly switch between a high resistance data state and a low resistance data state and include a free magnetic layer between two oxide barrier layers. The two reference layers are aligned perpendicularly.

In an embodiment of this disclosure is a magnetic cell that includes a ferromagnetic free layer having a free magnetization orientation direction and a first ferromagnetic pinned reference layer having a first reference magnetization orientation direction that is parallel or anti-parallel to the free magnetization orientation direction. A first oxide barrier layer is between the ferromagnetic free layer and the first ferromagnetic pinned reference layer. The magnetic cell further includes a second ferromagnetic pinned reference layer having a second reference magnetization orientation direction that is orthogonal to the first reference magnetization orientation direction. The ferromagnetic free layer is between the first ferromagnetic pinned reference layer and the second ferromagnetic pinned reference layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to magnetic stacks or cells (e.g., spin torque memory (STRAM) cells) having magnetic two reference layers or elements that have orthogonal magnetization orientation directions. These spin torque memory cells quickly switch between a high resistance data state and a low resistance data state and include a free magnetic layer between two oxide barrier layers. The two reference layers are aligned perpendicularly. This data cell construction increases the write speed and improves the tunneling magneto-resistance ratio of the data cell over conventional data cells that do not have perpendicularly aligned reference layers.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above", "below", etc. may be used in this disclosure. These terms should not be construed as limiting the position or orientation of a structure, but should be used as providing spatial relationship between the structures.

While the present disclosure is not so limited, an appreciation of various aspects of the disclosure will be gained through a discussion of the examples provided below.

Figure 1A:
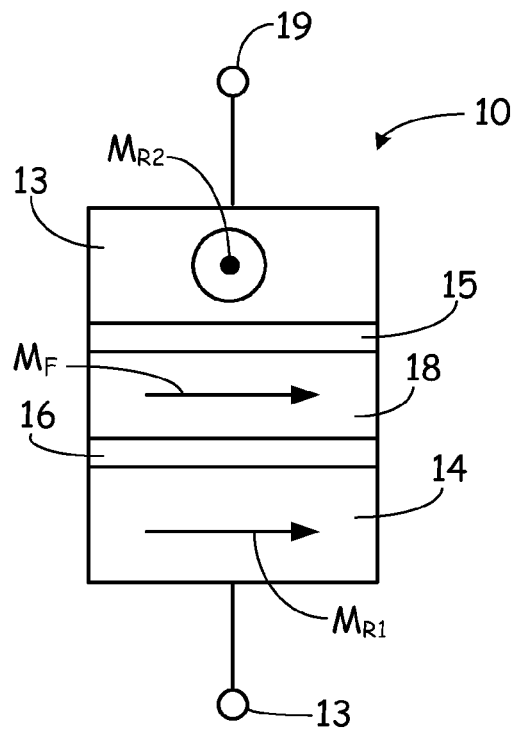
FIG. 1A is a schematic side view diagram of a magnetic cell in a low resistance data state and with orthogonal reference layer magnetization orientations.
Figure 1B:
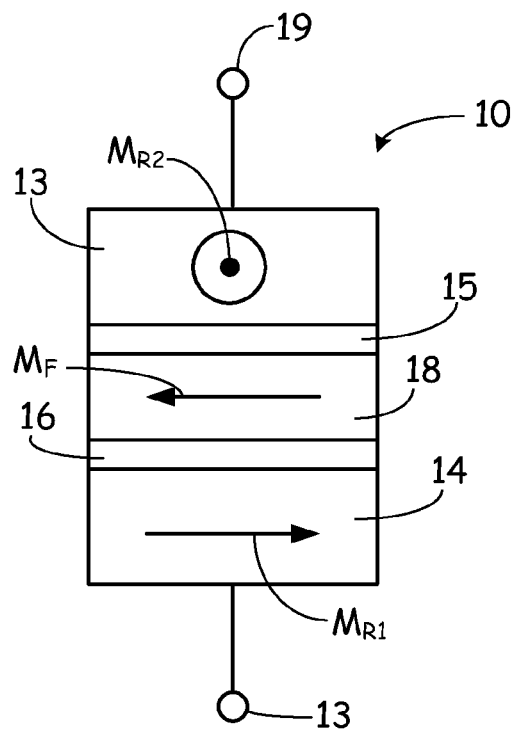
FIG. 1B is a schematic side view diagram of a magnetic cell in a high resistance data state and with orthogonal reference layer magnetization orientations.

FIG. 1A is a schematic side view diagram of a magnetic cell 10 in a low resistance data state and with orthogonal reference layer magnetization orientations. FIG. 1B is a schematic side view diagram of a magnetic cell 10 in a high resistance data state and with orthogonal reference layer magnetization orientations. The magnetic tunnel junction cell 10 includes a first ferromagnetic pinned reference layer or element 14 having a first reference magnetization orientation direction $M_{R1}$, a ferromagnetic free element or layer 18 having a free magnetization orientation direction $M_F$, and a first tunneling barrier 16 separating the first ferromagnetic pinned reference magnetic element 14 from the ferromagnetic free element 18. A second ferromagnetic pinned reference layer or element 13 has a second reference magnetization orientation direction $M_{R2}$ that is orthogonal to the first reference magnetization orientation direction $M_{R1}$. The ferromagnetic free layer is between the first ferromagnetic pinned reference layer 14 and the second ferromagnetic pinned reference layer 13. In many embodiments, a second tunneling barrier 15 separates the second ferromagnetic pinned reference magnetic element 13 from the ferromagnetic free element 18.

These elements or layers are disposed electrically between a first electrode 13 and a second electrode 19. While a single magnetic tunnel junction cell 10 is shown, it is understood that a plurality of magnetic tunnel junction cell 10 can be arranged in an array to form a memory array. Other layers, such as seed or capping layers, are not depicted for clarity.

The ferromagnetic free element 18 has a free magnetization orientation direction $M_F$ that is switchable between a high resistance data state (i.e., anti-parallel direction relative to the first ferromagnetic pinned reference magnetic element 14 magnetization orientation direction $M_{R1}$ and illustrated in FIG. 1B) and a low resistance data state (i.e., parallel direction relative to the first ferromagnetic pinned reference magnetic element 14 magnetization orientation direction $M_{R1}$ and illustrated in FIG. 1A). The ferromagnetic free element or layer 18, first ferromagnetic pinned reference magnetic element 14, and second ferromagnetic pinned reference magnetic element 13 have in-plane magnetic anisotropy.

While the first ferromagnetic pinned reference element 14 is illustrated as a single layer, it is understood that this element 14 can include two or more layer such as, a ferromagnetic reference (pinned) layer and a antiferromagnetic reference (pinning) layer, where the antiferromagnetic reference layer serves to fix the magnetization of the ferromagnetic reference layer. In other embodiments, the first ferromagnetic pinned reference element 14 includes more than one ferromagnetic layer that are coupled anti-ferromagnetically to each other (e.g., synthetic antiferromagnet). The ferromagnetic reference layer can be formed of any useful material such as, for example, alloys and materials including Co, Fe, and/or Ni. Ternary alloys, such as CoFeB, may be particularly useful because of their lower moment and high polarization ratio, which are desirable for the spin-current switching. The antiferromagnetic reference layer can be formed of any useful material such as, for example, IrMn, FeMn, and/or PtMn.

While the second ferromagnetic pinned reference element 13 is illustrated as a single layer, it is understood that this element 13 can include two or more layer such as, a ferromagnetic reference (pinned) layer and an antiferromagnetic reference (pinning) layer, where the antiferromagnetic reference layer serves to fix the magnetization of the ferromagnetic reference layer. In other embodiments, the second ferromagnetic pinned reference element 13 includes more than one ferromagnetic layer that are coupled anti-ferromagnetically to each other (e.g., synthetic antiferromagnet). The ferromagnetic reference layer can be formed of any useful material such as, for example, alloys and materials including Co, Fe, and/or Ni. Ternary alloys, such as CoFeB, may be particularly useful because of their lower moment and high polarization ratio, which are desirable for the spin-current switching. The antiferromagnetic reference layer can be formed of any useful material such as, for example, IrMn, FeMn, and/or PtMn.

The ferromagnetic free element 18 can be formed of any useful soft magnetic material that allows a magnetization orientation of the ferromagnetic free element 18 to switch between a first magnetization orientation and an opposing second magnetization orientation. In many embodiments the ferromagnetic free element 18 is formed of a CoFeB material such as, $Co_{65}Fe_{30}B_{15}$ and having a magnetic saturation in a range from 1200 to 500 emu/cc, for example. The first magnetization orientation can be parallel with a magnetization orientation of the first ferromagnetic pinned reference element 14, forming a low resistance data state or a "0" data state. The second magnetization orientation can be anti-parallel with a magnetization orientation of the first ferromagnetic pinned reference element 14, forming a high resistance data state or a "1" data state. The ferromagnetic free layer can be formed of any useful material such as, for example, alloys and materials including Co, Fe, and/or Ni. Ternary alloys, such as CoFeB, may be particularly useful because of their lower moment and high polarization ratio, which are desirable for the spin-current switching. Thus the ferromagnetic free element 18 can be switched due to spin torque transfer induced by a current passing through the magnetic cell 10.

The first and second tunneling or oxide barrier 15, 16 is an electrically insulating and non-magnetic material. The tunneling or oxide barrier 15, 16 can be formed of any useful electrically insulating and non-magnetic material such as, AlO, MgO, and/or TiO, for example. In some embodiments, the oxide barrier layers 15, 16 have a thickness of about 0.5-2 nm.

Electrodes 13, 19 electrically connect the magnetic tunnel junction cell 10 to a control circuit providing read and write currents through the magnetic tunnel junction cell 10. Resistance across the magnetic tunnel junction cell 10 is determined by the relative orientation of the magnetization vectors or magnetization orientations of ferromagnetic layers 14, 18. The magnetization directions of the ferromagnetic pinned reference layers 14, 13 are pinned in a predetermined direction while the magnetization direction of ferromagnetic free layer 18 is free to rotate under the influence of spin torque when a current flows through the magnetic tunnel junction cell 10.

Switching the resistance state and hence the data state of magnetic tunnel junction cell 10 via spin-torque transfer occurs when a current, passing through a magnetic layer of magnetic tunnel junction cell 10, becomes spin polarized and imparts a spin torque on the ferromagnetic free layer 18 of magnetic tunnel junction cell 10. When a sufficient spin torque is applied (sufficient to overcome the energy barrier E) to ferromagnetic free layer 18, the magnetization orientation of the ferromagnetic free layer 18 can be switched between two opposite directions and accordingly, magnetic tunnel junction cell 10 can be switched between the parallel state (i.e., low resistance state or "0" data state) and anti-parallel state (i.e., high resistance state or "1" data state).

Figure 2:
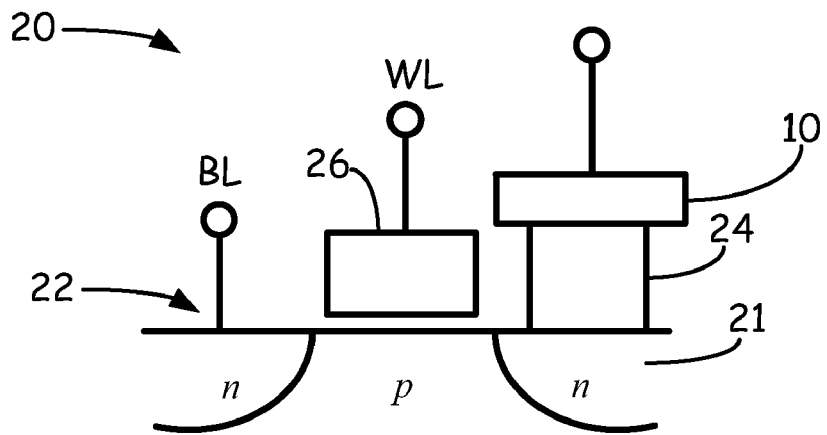
FIG. 2 is a schematic diagram of an illustrative memory unit including a memory cell and a semiconductor transistor.

FIG. 2 is a schematic diagram of an illustrative memory unit including a memory unit 20 and a semiconductor transistor 22. Memory unit 20 includes a magnetic tunnel junction cell 10, as described herein, electrically coupled to semiconductor transistor 22 via an electrically conducting element 24. Transistor 22 includes a semiconductor substrate 21 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory cell 10. An array of memory units 20 can be formed on a semiconductor substrate utilizing semiconductor fabrication techniques.

Figure 3:
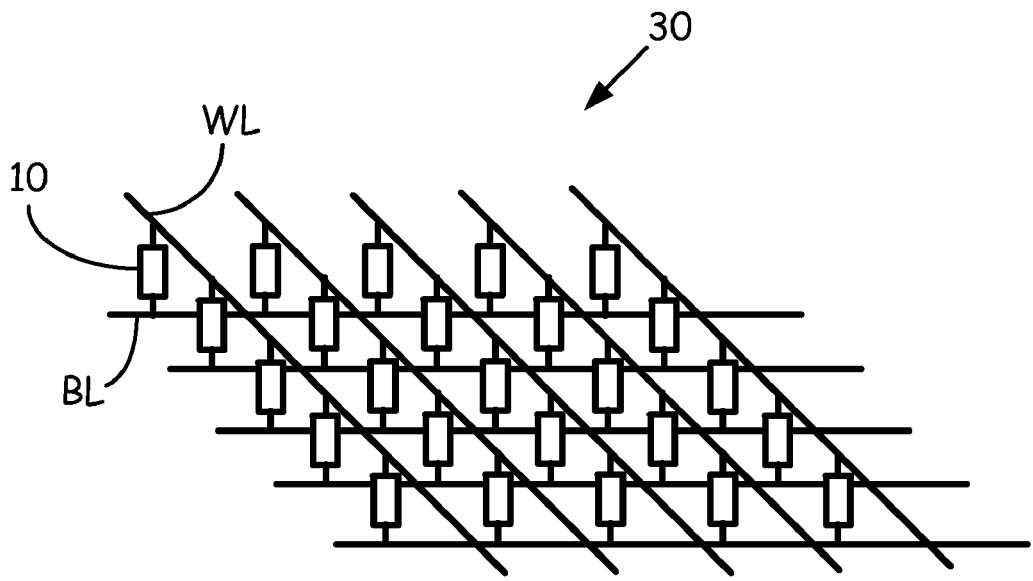
FIG. 3 is a schematic diagram of an illustrative memory array.

FIG. 3 is a schematic diagram of an illustrative memory array 30. Memory array 30 includes a plurality of word lines WL and a plurality of bit lines BL forming a cross-point array. At each cross-point a memory cell 10, as described herein, is electrically coupled to word line WL and bit line BL. A select device (not shown) can be at each cross-point or at each word line WL and bit line BL.

Figure 4:
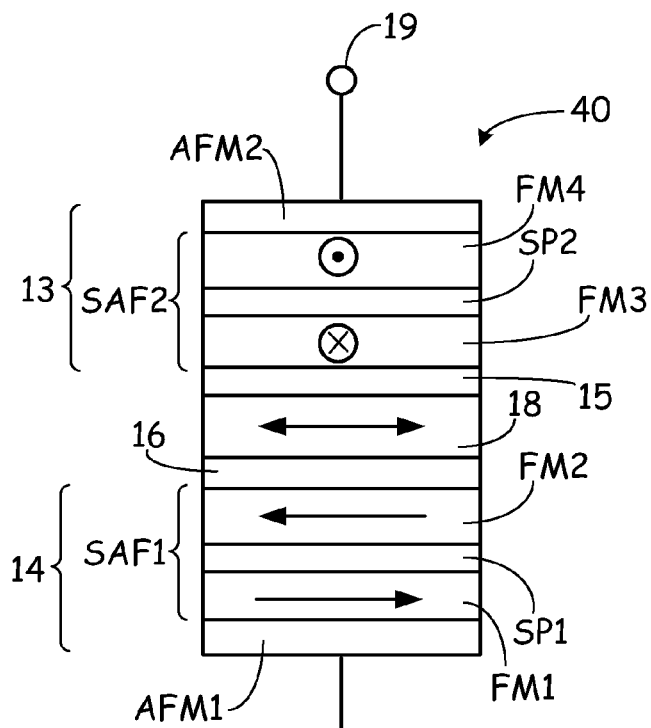
FIG. 4 is a schematic side view diagram of another magnetic cell with orthogonal reference layer magnetization orientations.

FIG. 4 is a schematic side view diagram of another magnetic cell 40 with orthogonal reference layer magnetization orientations. The magnetic tunnel junction cell 40 includes a first ferromagnetic pinned reference layer or element 14 having a first reference magnetization orientation direction, a ferromagnetic free element or layer 18 having a free magnetization orientation direction and a first tunneling barrier 16 separating the first ferromagnetic pinned reference magnetic element 14 from the ferromagnetic free element 18. A second ferromagnetic pinned reference layer or element 13 has a second reference magnetization orientation direction that is orthogonal to the first reference magnetization orientation direction. The ferromagnetic free layer 18 is between the first ferromagnetic pinned reference layer 14 and the second ferromagnetic pinned reference layer 13. In many embodiments, a second tunneling barrier 15 separates the second ferromagnetic pinned reference magnetic element 13 from the ferromagnetic free element 18.

These elements or layers are disposed electrically between a first electrode 13 and a second electrode 19. While a single magnetic tunnel junction cell 10 is shown, it is understood that a plurality of magnetic tunnel junction cell 10 can be arranged in an array to form a memory array. Other layers, such as seed or capping layers, are not depicted for clarity.

The first ferromagnetic pinned reference layer or element 14 includes a first synthetic anti-ferromagnetic element SAF1 and a first antiferromagnetic reference (pinning) layer AFM1. The first synthetic anti-ferromagnetic element SAF1 includes two ferromagnetic layers FM1, FM2 anti-ferromagnetically coupled and separated by a non-magnetic and electrically conducting spacer layer SP1. The second ferromagnetic pinned reference layer or element 13 includes a second synthetic anti-ferromagnetic element SAF2 and a second antiferromagnetic reference (pinning) layer AFM2. The second synthetic anti-ferromagnetic element SAF2 includes two ferromagnetic layers FM3, FM4 anti-ferromagnetically coupled and separated by a non-magnetic and electrically conducting spacer layer SP2.

In many embodiments the first antiferromagnetic reference (pinning) layer AFM1 has a different material composition than the second antiferromagnetic reference (pinning) layer AFM2. The first antiferromagnetic reference (pinning) layer AFM1 can have a greater blocking temperature than the second antiferromagnetic reference (pinning) layer AFM2. Thus the first ferromagnetic pinned reference layer or element 14 can have its magnetization orientation set at a higher temperature than the later formed second ferromagnetic pinned reference layer or element 13. Then the second ferromagnetic pinned reference layer or element 13 can have its magnetization orientation set at a lower temperature than the prior formed first ferromagnetic pinned reference layer or element 14.

Figure 5:
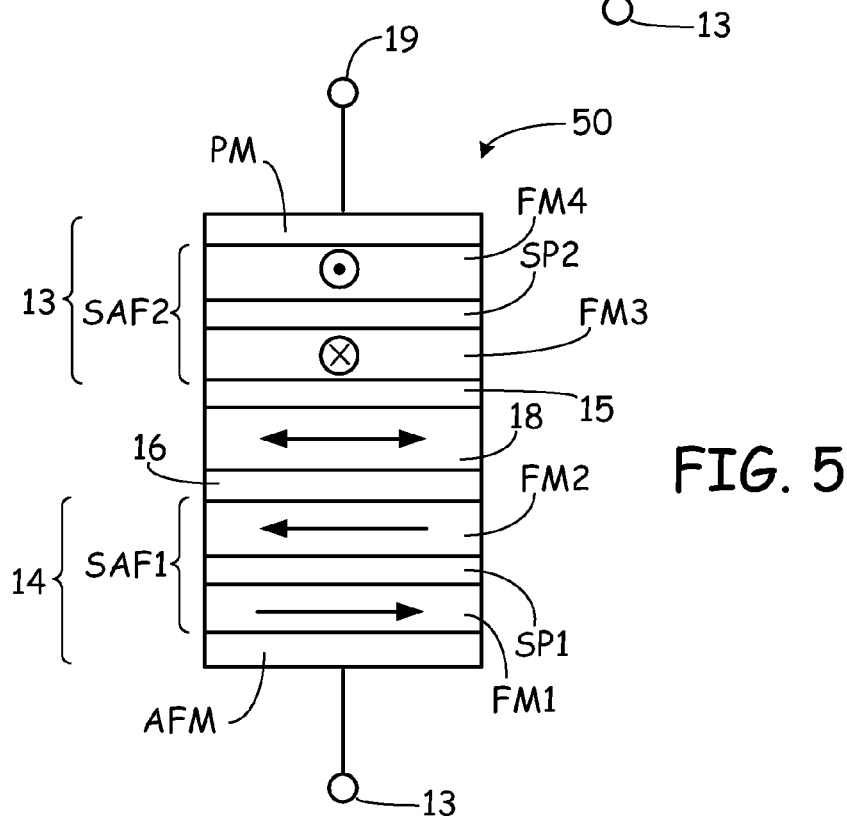
FIG. 5 is a schematic side view diagram of another magnetic cell with orthogonal reference layer magnetization orientations.

FIG. 5 is a schematic side view diagram of another magnetic cell 50 with orthogonal reference layer magnetization orientations. The magnetic tunnel junction cell 50 includes a first ferromagnetic pinned reference layer or element 14 having a first reference magnetization orientation direction, a ferromagnetic free element or layer 18 having a free magnetization orientation direction and a first tunneling barrier 16 separating the first ferromagnetic pinned reference magnetic element 14 from the ferromagnetic free element 18. A second ferromagnetic pinned reference layer or element 13 has a second reference magnetization orientation direction that is orthogonal to the first reference magnetization orientation direction. The ferromagnetic free layer 18 is between the first ferromagnetic pinned reference layer 14 and the second ferromagnetic pinned reference layer 13. In many embodiments, a second tunneling barrier 15 separates the second ferromagnetic pinned reference magnetic element 13 from the ferromagnetic free element 18.

These elements or layers are disposed electrically between a first electrode 13 and a second electrode 19. While a single magnetic tunnel junction cell 10 is shown, it is understood that a plurality of magnetic tunnel junction cell 10 can be arranged in an array to form a memory array. Other layers, such as seed or capping layers, are not depicted for clarity.

The first ferromagnetic pinned reference layer or element 14 includes a first synthetic anti-ferromagnetic element SAF1 and a antiferromagnetic reference (pinning) layer AFM. The first synthetic anti-ferromagnetic element SAF1 includes two ferromagnetic layers FM1, FM2 anti-ferromagnetically coupled and separated by a non-magnetic and electrically conducting spacer layer SP1. The second ferromagnetic pinned reference layer or element 13 includes a second synthetic anti-ferromagnetic element SAF2 and a permanent magnet PM. The second synthetic anti-ferromagnetic element SAF2 includes two ferromagnetic layers FM3, FM4 anti-ferromagnetically coupled and separated by a non-magnetic and electrically conducting spacer layer SP2. The magnetization orientation of the first ferromagnetic pinned reference layer or element 14 can be set with a magnetic set anneal and the magnetization orientation of the second ferromagnetic pinned reference layer or element 13 can be set with the permanent magnet PM.

The various structures of this disclosure may be made by thin film techniques such as chemical vapor deposition (CVD), physical vapor deposition (PVD), sputter deposition, and atomic layer deposition (ALD).

Thus, embodiments of the MAGNETIC STACK HAVING REFERENCE LAYERS WITH ORTHOGONAL MAGNETIZATION ORIENTATION DIRECTIONS are disclosed. The implementations described above and other implementations are within the scope of the following claims. One skilled in the art will appreciate that the present disclosure can be practiced with embodiments other than those disclosed.

The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a device, system or apparatus. For example, if a device includes a first layer, it should not be implied that a second layer is required in that device.

What is claimed is:

1. A magnetic cell comprising:
   a ferromagnetic free layer having a free magnetization orientation direction; a first ferromagnetic pinned reference layer having a first reference magnetization orientation direction that is parallel or anti-parallel to the free magnetization orientation direction;
   a first oxide barrier layer between the ferromagnetic free layer and the first ferromagnetic pinned reference layer; and
   a second ferromagnetic pinned reference layer comprising a permanent magnetic and having a second reference magnetization orientation direction that is orthogonal to the first reference magnetization orientation direction, the ferromagnetic free layer between the first ferromagnetic pinned reference layer and the second ferromagnetic pinned reference layer, and wherein the second ferromagnetic pinned reference layer comprises a synthetic anti-ferromagnetic element.

2. The magnetic cell of claim 1 wherein the ferromagnetic free layer, first ferromagnetic pinned reference layer, and second ferromagnetic pinned reference layer, have in-plane magnetic anisotropy.

3. The magnetic cell of claim 1 further comprising a second oxide barrier layer between the ferromagnetic free layer and the second ferromagnetic pinned reference layer.

4. The magnetic cell of claim 1 wherein the first ferromagnetic pinned reference layer comprises a synthetic anti-ferromagnetic element.

5. The magnetic cell of claim 1 wherein the ferromagnetic free layer switches between a high resistance data state and a low resistance data state due to spin torque transfer induced by a current passing through the magnetic cell.

6. The magnetic cell of claim 1 wherein the free magnetization orientation direction is orthogonal to the second reference magnetization orientation direction.

7. A spin torque transfer magnetic cell comprising:
   a ferromagnetic flee layer having an in-plane free magnetization orientation direction that switches between a high resistance data state and a low resistance data state due to spin torque transfer induced by a current passing through the magnetic cell;
   a first ferromagnetic pinned reference layer having a first reference magnetization orientation direction that is parallel or anti-parallel to the free magnetization orientation direction;
   a first oxide barrier layer between the ferromagnetic free layer and the first ferromagnetic pinned reference layer;
   a second ferromagnetic pinned reference layer comprising a permanent magnetic and having an in-plane second reference magnetization orientation direction that is orthogonal to the free magnetization orientation direction; and
   a second oxide barrier layer between the ferromagnetic free layer and the second ferromagnetic pinned reference layer, and wherein the second ferromagnetic pinned reference layer comprises a synthetic anti-ferromagnetic element.

8. The spin torque transfer magnetic cell of claim 7 wherein the first ferromagnetic pinned reference layer comprises a synthetic anti-ferromagnetic element.

9. The spin torque transfer magnetic cell of claim 7 wherein the free magnetization orientation direction is orthogonal to the second reference magnetization orientation direction.

10. A spin torque transfer magnetic cell comprising:
    a ferromagnetic flee layer having an in-plane free magnetization orientation direction that switches between a high resistance data state and a low resistance data state due to spin torque transfer induced by a current passing through the magnetic cell;
    a first ferromagnetic pinned reference layer having a first reference magnetization orientation direction that is parallel or anti-parallel to the free magnetization orientation direction;
    a first oxide barrier layer between the ferromagnetic free layer and the first ferromagnetic pinned reference layer;
    a second ferromagnetic pinned reference layer comprising a permanent magnetic and having an in-plane second reference magnetization orientation direction that is orthogonal to the first reference magnetization orientation direction; and
    a second oxide barrier layer between the ferromagnetic free layer and the second ferromagnetic pinned reference layer, and wherein the second ferromagnetic pinned reference layer comprises a synthetic anti-ferromagnetic element.

11. The spin torque transfer magnetic cell of claim 10 wherein the first ferromagnetic pinned reference layer comprises a synthetic anti-ferromagnetic element.

* * * * *